(12) United States Patent
Ariyama

(10) Patent No.: US 7,956,598 B2
(45) Date of Patent: Jun. 7, 2011

(54) VOLTAGE DIVIDING CIRCUIT AND MAGNETIC SENSOR CIRCUIT

(75) Inventor: Minoru Ariyama, Chiba (JP)

(73) Assignee: Seiko Instruments Inc. (JP)

( * ) Notice: Subject to any disclaimer, the term of this patent is extended or adjusted under 35 U.S.C. 154(b) by 221 days.

(21) Appl. No.: 12/192,421

(22) Filed: Aug. 15, 2008

(65) Prior Publication Data

US 2009/0079411 A1    Mar. 26, 2009

(30) Foreign Application Priority Data

Aug. 22, 2007   (JP) ................. 2007-215949

(51) Int. Cl.
*G05F 3/16* (2006.01)
*G05F 3/20* (2006.01)
*G01R 33/06* (2006.01)
*G01R 33/02* (2006.01)

(52) U.S. Cl. .......................... 323/313; 324/251; 324/252

(58) Field of Classification Search .................. 324/251, 324/252; 323/313
See application file for complete search history.

(56) References Cited

U.S. PATENT DOCUMENTS 4,857,841 A * 8/1989 Hastings et al. ............. 324/252
6,118,262 A * 9/2000 Suzuki .......................... 323/313

FOREIGN PATENT DOCUMENTS

JP    9-166405 A    6/1997
JP    10-268253 A    10/1998

* cited by examiner

*Primary Examiner* — Jue Zhang
(74) *Attorney, Agent, or Firm* — Brinks Hofer Gilson & Lione

(57) ABSTRACT

To provide a variable voltage dividing circuit capable of changing voltage values of a detection point and a release point along with a change in power supply voltage without changing a hysteresis width. The variable voltage dividing circuit according to the present invention includes: a voltage dividing unit which includes a resistor string formed of a plurality of resistors connected in series, and outputs divided voltages divided at connection points of the plurality of resistors, one end of the resistor string being applied with a first voltage, another end thereof being applied with a second voltage; a first constant current source connected to a first connection point of the resistor string; and a second constant current source connected to a second connection point located symmetrically to the first connection point with respect to a center of the resistor string in the resistor string, in which, in accordance with a voltage difference between the first voltage and the second voltage, any one of the first constant current source and the second constant current source subtracts a first adjustment current from a current flowing through the resistor string, and another thereof feeds a second adjustment current to the resistor string.

6 Claims, 9 Drawing Sheets

⊗ FORWARD MAGNETIC FIELD
⊙ REVERSE MAGNETIC FIELD

UP ← VOLTAGE DIVIDING POINT
OF FIRST VARIABLE RESISTOR → DOWN

DOWN ← VOLTAGE DIVIDING POINT
OF SECOND VARIABLE RESISTOR → UP

UP ← VOLTAGE DIVIDING POINT
OF FIRST VARIABLE RESISTOR → DOWN

DOWN ← VOLTAGE DIVIDING POINT
OF SECOND VARIABLE RESISTOR → UP

VOLTAGE DIVIDING CIRCUIT AND MAGNETIC SENSOR CIRCUIT

RELATED APPLICATIONS

This application claims priority under 35 U.S.C. §119 to Japanese Patent Application No. JP2007-215949 filed on Aug. 22, 2007, the entire content of which is hereby incorporated by reference.

TECHNICAL FIELD

The present invention relates to a voltage dividing circuit for generating, in a detection circuit using a sensor having sensitivity proportional to a power supply voltage, a reference voltage used as a threshold when output of the sensor is detected, and to a magnetic sensor circuit using the same.

BACKGROUND ART

Conventionally, there has been used a magnetic sensor such as a proximity switch for detecting presence/absence of a magnetic body portion of an object to be detected which is located at a close position.

For example, a portable electronic device such as a cellular phone using a folding structure has a function for controlling power saving, for example, turning off a backlight of liquid crystal or limiting a communication function when being folded, and is equipped with the above-mentioned magnetic sensor circuit (for example, see Patent Document 1).

A hole element is used for the magnetic sensor in many cases, but as in the case of a piezo resistive sensor (for example, pressure sensor, acceleration sensor, or distortion sensor) or the like, sensitivity of the hole element is proportional to a power supply voltage, and hence sensitivity varies in accordance with the power supply voltage. Therefore, it is necessary to change a voltage value of a reference voltage in the case of detecting output of the sensor.

Further, in the magnetic sensor using the hole element, in order that an output value of the object to be detected when being located at a close position or remote position exhibits hysteresis and malfunction due to noise is prevented, reference voltages used at a detection point and a release point are made to be different from each other and need to be set so as to have a hysteresis width. In other words, the hysteresis width shows a voltage difference between a voltage value of the detection point and a voltage value of the release point.

A reference voltage generating circuit illustrated in FIG. 12 is a circuit for outputting a plurality of reference voltages and bringing those reference voltages into correspondence with a change in power supply voltage (for example, see Patent Document 2).

The reference voltage generating circuit is formed of a first operational amplifier 3a, a second operational amplifier 3b, and a plurality of resistors connected in series which are interposed between output terminals of the first operational amplifier 3a and the second operational amplifier 3b.

A first input signal is input to a first input terminal (inverting input terminal) of the first operational amplifier 3a, a second input signal is input to a second input terminal (inverting input terminal) of the second operational amplifier 3b, and voltages of those signals are impedance-converted by an inverting amplifier, to thereby output the divided voltage for each connection point of the plurality of resistors connected in series as the plurality of reference voltages.

When a first variable resistor 5a and a second variable resistor 5b, which are used for offset voltage adjustment, are provided to non-inverting input terminals of the first operational amplifier 3a and the second operational amplifier 3b, respectively, an offset voltage can be adjusted.

A resistance value is adjusted such that the first variable resistor 5a and the second variable resistor 5b are caused to work in directions opposite to each other in accordance with a voltage level of an input signal output from the magnetic sensor. Specifically, in the case where an output voltage at a midpoint of the first variable resistor 5a is increased, an output voltage at a midpoint of the second variable resistor 5b is decreased. Conversely, in the case where the output voltage at the midpoint of the first variable resistor 5a is decreased, the output voltage at the midpoint of the second variable resistor 5b is increased.

Through the above-mentioned adjustment, the reference voltages output from connection points of the respective resistors other than the midpoints thereof can be changed without changing the voltages at the midpoints of the plurality of resistors connected in series.

Patent Document 1 JP 09-166405 A
Patent Document 2 JP 10-268253 A

However, in the conventional reference voltage generating circuit described above, as illustrated in FIG. 13, when the first variable resistor 5a and the second variable resistor 5b are changed and voltage values of the detection point and the release point are changed within a voltage range between both ends of the resistors connected in series for voltage division, a hysteresis width between the detection point and the release point is also changed along with those changes.

For this reason, the conventional reference voltage generating circuit has a disadvantage in that, in the case where an output value of the hole element is used as a reference voltage of a comparator to be detected, as illustrated in FIG. 14, sensitivity of detection and release with respect to a magnetic flux density of a magnetic field becomes sufficient when the hysteresis width is reduced, and reaction to noise is excessively sensitive, whereby the magnetic sensor circuit judges erroneous detection and erroneous release.

The present invention has been made in view of the above-mentioned circumstances, and an object thereof is to provide a variable voltage dividing circuit capable of changing voltage values of a detection point and a release point along with a change in power supply voltage without changing a hysteresis width.

SUMMARY OF THE INVENTION

A variable voltage dividing circuit according to the present invention includes: a voltage dividing unit which includes a resistor string including a plurality of resistors connected in series and outputs divided voltages divided at connection points of the plurality of resistors, one end of the resistor string being applied with a first voltage, another end thereof applied with a second voltage; a first constant current source connected to a first connection point of the resistor string; and a second constant current source connected to a second connection point located symmetrically to the first connection point with respect to a center of the resistor string in the resistor string, in which, in accordance with a voltage difference between the first voltage and the second voltage, any one of the first constant current source and the second constant current source subtracts a first adjustment current from a current flowing through the resistor string, and another thereof feeds a second adjustment current to the resistor string.

In the variable voltage dividing circuit according to the present invention: the first adjustment current and the second adjustment current have the same current value; and in response to a change of the first voltage and a change of the second voltage, the first constant current source and the second constant current source each control the first adjustment current and the second adjustment current by a current value which does not change a voltage between connection points between the first connection point and a first terminal and a voltage between connection points between the second connection point and a second terminal.

In the variable voltage dividing circuit according to the present invention: the plurality of resistors included in the voltage dividing unit are a first resistor, a second resistor, a third resistor, a fourth resistor, a fifth resistor, and a sixth resistor which are connected in series; one end of the first resistor is applied with the first voltage, and another end of the sixth resistor is applied with the second voltage; and a resistance value of the second resistor is set to be smaller compared with the first resistor, and a resistance value of the fifth resistor is set to be smaller compared with the sixth resistor.

In the variable voltage dividing circuit according to the present invention, the first constant current source and the second constant current source are each formed of a current mirror circuit using the same constant current generated by a third constant current source.

In the variable voltage dividing circuit according to the present invention, the third constant current source includes: a reference current generating unit which generates a reference current; a variable resistor which is fed with the reference current and has a variable resistance value; an operational amplifier which includes a non-inverting input terminal applied with a voltage generated in the variable resistor, and an inverting input terminal connected with a power source through another resistor; and a MOS transistor including a source, a drain, and a gate, any one of the source and the drain being connected with the inverting input terminal of the operational amplifier, the gate being connected to an output terminal of the operational amplifier, for outputting the adjustment current from another of the source and the drain.

A magnetic sensor circuit according to the present invention includes: any one of the variable voltage dividing circuits described above; a selector which outputs a divided voltage from any one of connection points of the variable voltage dividing circuit in correspondence with a selection signal; and an operational amplifier which includes one terminal input with a detection voltage of a magnetic sensor, and another terminal input with the divided voltage output from the selector.

By adopting the above-mentioned configuration, according to the present invention, the reference voltages serving as the detection point and the release point of the sensor that has sensitivity that varies depending on a power supply voltage can be easily adjusted to appropriate voltages while keeping the hysteresis width constant.

DETAILED DESCRIPTION OF THE PREFERRED EMBODIMENTS

Figure 1:
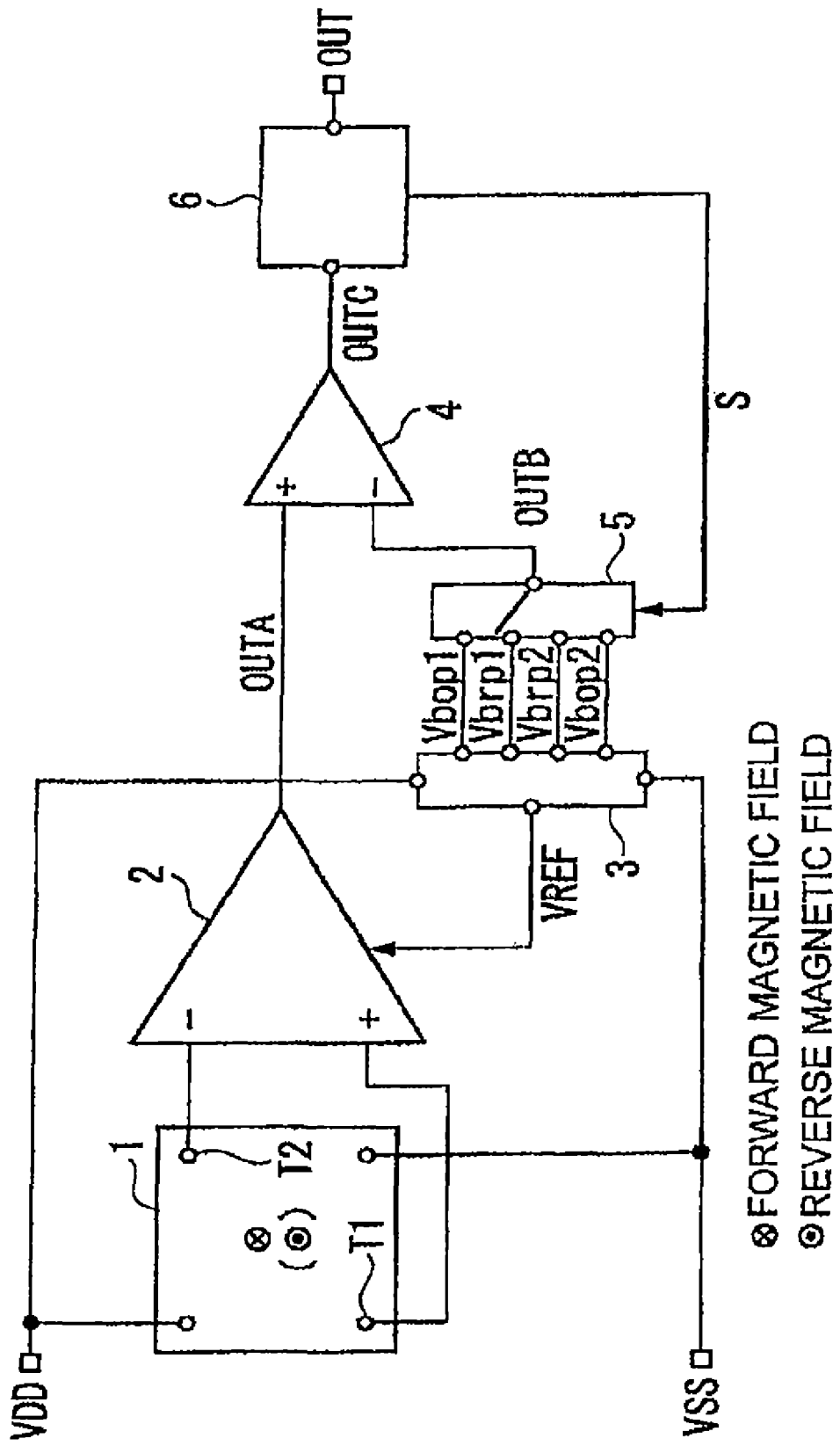
FIG. 1 A block diagram illustrating a configuration example of a magnetic sensor circuit using a variable voltage dividing circuit according to an embodiment of the present invention.

Hereinafter, a magnetic sensor circuit using a variable voltage dividing circuit according to an embodiment of the present invention is described with reference to the drawings. FIG. 1 is a block diagram illustrating a configuration example of the magnetic sensor circuit according to this embodiment.

In FIG. 1, a magnetic sensor 1 is, for example, a hole element, and is input with a power supply voltage VDD and a ground voltage VSS, in which polarities of voltages output from output terminals T1 and T2 are reversed depending on a direction of a magnetic field passing through the magnetic sensor 1.

Figure 2:
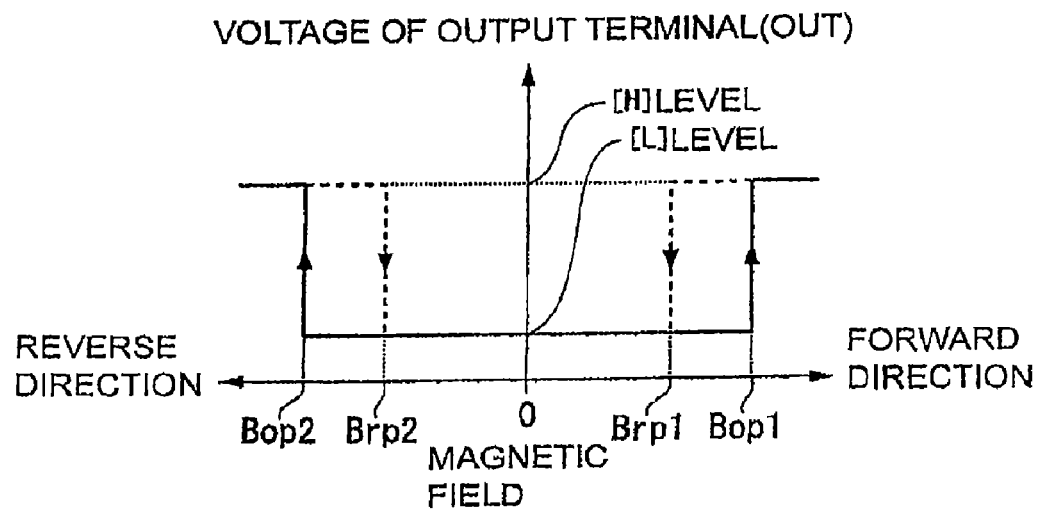
FIG. 2 A waveform diagram illustrating a correspondence between a detection magnetic flux density and a release magnetic flux density which are detected by a magnetic sensor of FIG. 1 and an output of a signal processing circuit.

Here, in the case where the magnetic field passing through the hole element 1 of FIG. 1 is in a forward direction as illustrated in FIG. 2, a detection magnetic flux density to be detected is assumed to be Bop1 and a release magnetic flux density to be released is assumed to be Brp1. On the other hand, in the case where the magnetic field passing through the hole element 1 is in a reverse direction, a detection magnetic flux density to be detected is assumed to be Bop2, and a release magnetic flux density to be released is assumed to be Brp2.

In an amplifier 2, the output terminal T1 and the output terminal T2 of the magnetic sensor 1 are connected to a non-inverting input terminal (+) and an inverting input terminal (−), respectively, and a voltage difference between the non-inverting input terminal (+) and the inverting input terminal (−) is amplified with a reference voltage VREF as a reference, whereby the voltage difference is output from an output terminal as a detection voltage OUTA.

In other words, when a voltage input to the non-inverting input terminal (+) is higher than a voltage input to the inverting input terminal (−) (in the case where the magnetic field passing through the hole element 1 is in the forward direction), the amplifier 2 adds a voltage obtained by amplifying the difference to the reference voltage VREF to be output. When the voltage input to the inverting input terminal (−) is higher than the voltage input to the non-inverting input terminal (+) (in the case where the magnetic field passing through the hole element 1 is in the reverse direction), the amplifier 2 subtracts a voltage obtained by amplifying the difference from the reference voltage VREF to be output.

Here, in the case where the magnetic field passing through the hole element 1 is in the forward direction, the voltages detected by the amplifier 2 are assumed to be a detection voltage Vbop1 corresponding to the detection magnetic flux density Bop1 to be detected and a release voltage Vbrp1 corresponding to the release magnetic flux density Brp1 to be released. On the other hand, in the case where the magnetic field passing through the hole element 1 is in the reverse direction, the voltages detected by the amplifier 2 are assumed to be a detection voltage Vbop2 corresponding to the detection magnetic flux density Bop2 to be released and a release voltage Vbrp2 corresponding to the release magnetic flux density Brp2 to be released.

A variable voltage dividing circuit 3 generates divided voltages corresponding to the power supply voltage, and outputs the divided voltages as a plurality of threshold voltages for detecting whether the detection voltage or the release voltage passes the detection point or the release point, respectively.

Therefore, between VDD and VSS, the variable voltage dividing circuit 3 outputs, as the divided voltage, the detection voltage Vbop1, the release voltage Vbrp1, the detection voltage Vbop2, the release voltage Vbrp2, and the reference voltage VREF with a relationship of Vbop1>Vbrp1>VREF>Vbrp2>Vbop2.

Further, the variable voltage dividing circuit 3 is capable of adjusting voltages of Vbop1, Vbrp1, Vbrp2, and Vbop2 in accordance with sensitivity of the sensor with VREF as a midpoint between VDD and VSS while keeping the hysteresis width "Vbop1−Vbrp1" and the hysteresis width "Vbrp2−Vbop2" as constant potential differences.

The variable voltage dividing circuit 3 outputs the detection voltage Vbop1, the release voltage Vbrp1, the detection voltage Vbop2, and the release voltage Vbrp2 to a selector 5, and outputs the reference voltage VREF to the amplifier 2.

A comparator 4 compares a detection voltage OUTA output from the amplifier 2 with a reference voltage OUTB input from the selector 5. As a result of the comparison, for example, the comparator 4 outputs a result signal of an "H" level when the detection voltage OUTA is higher than the reference voltage, and outputs a result signal OUTC of an "L" level when the detection voltage OUTA is lower than the reference voltage OUTB.

By detecting detection or release, the selector 5 outputs any of the detection voltage Vbop1, the release voltage Vbrp1, the detection voltage Vbop2, and the release voltage Vbrp2 which are output from the variable voltage dividing circuit 3 to the comparator 4 as the reference voltage OUTB in response to a control signal from a signal processing circuit 6.

The signal processing circuit 6 performs data processing on a determination result of the comparator 4 depending on which of the detection voltage Vbop1, the release voltage Vbrp1, the detection voltage Vbop2, and the release voltage Vbrp2 is set as the reference voltage by a control signal S with respect to the selector 5.

For example, in the case of outputting a control signal for selecting the detection voltage Vbop1 to the selector 5, the signal processing circuit 6 outputs the signal of the "H" level when the detection voltage OUTA is higher than the detection voltage Vbop1. After once detecting that the detection voltage OUTA is higher than the detection voltage Vbop1, in the case of outputting a control signal for selecting the release voltage Vbrp1 to the selector 5, the signal processing circuit 6 outputs the signal of the "L" level from the output voltage OUT when the detection voltage OUTA is lower than the detection voltage Vbrp1.

On the other hand, in the case of outputting a control signal for selecting the detection voltage Vbop2, the signal processing circuit 6 outputs the signal of the "L" level from the output voltage OUT when the detection voltage OUTA is lower than the detection voltage Vbop2. After once detecting that the detection voltage OUTA is lower than the detection voltage Vbop2, in the case of outputting the control signal for selecting the release voltage Vbrp2 to the selector 5, the signal processing circuit 6 outputs the signal of the "L" level from the output voltage OUT when the detection voltage OUTA is higher and lower than the detection voltage Vbrp2.

Here, a sequence for changing the reference voltage through selection by the selector 5 can sequentially be set in the signal processing circuit 6 as to which of the voltages is to be selected next as the reference voltage in accordance with the detected voltage value as described above. As an initial state of the selector 5, it is possible to appropriately select which of the voltages is to be set as the reference voltage, and for example, the initial state is set to a state in which the detection voltage Vbop1 is selected as the reference voltage.

Here, when the detection voltage Vbop1 is set as the reference voltage, the comparator 4 outputs the result signal OUTC of the "H" level in the case where a voltage value of the result signal OUTC is higher than the detection voltage Vbop1.

Then, when an output of the comparator 4 is input as the "H" level, the signal processing circuit 6 causes the output terminal voltage OUT to be at the "H" level as illustrated in FIG. 2, and outputs a control signal for selecting the release voltage Vbrp1 as the reference voltage to the selector 5.

A sequence as to which of the voltages input to the selector 5 is output as the reference voltage by the signal processing circuit 6 is appropriately changed in accordance with the specifications of the sensor circuit.

Figure 3:
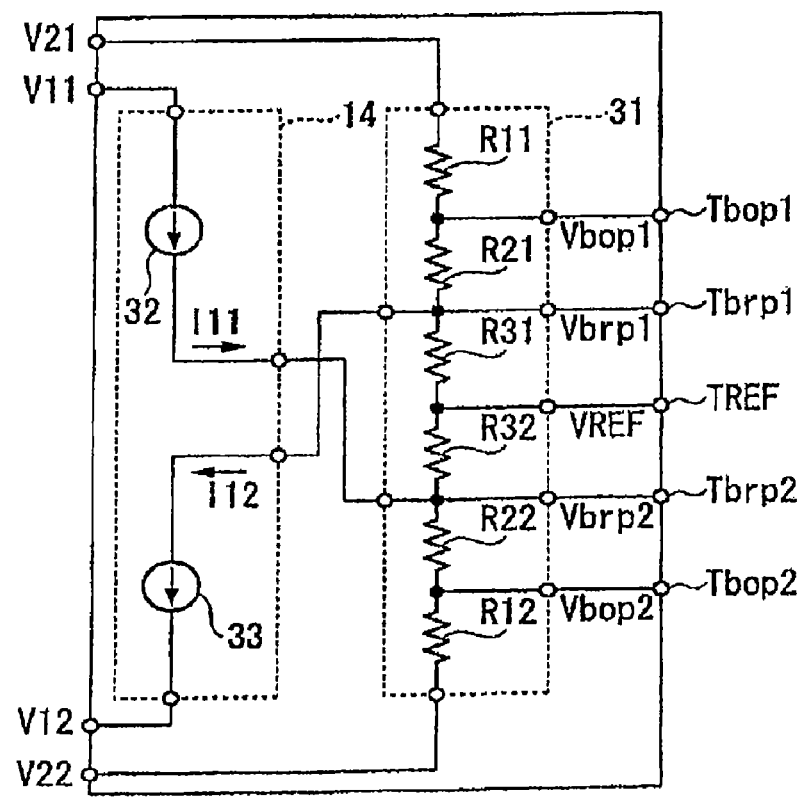
FIG. 3 A block diagram illustrating a configuration example of a variable voltage dividing circuit of FIG. 1.

Next, the configuration of the variable voltage dividing circuit 3 of FIG. 1 is described with reference to FIG. 3. FIG. 3 is a conceptual diagram illustrating a configuration example of the variable voltage dividing circuit 3 which outputs divided voltages corresponding to the above-mentioned detection voltages and release voltages.

The variable voltage dividing circuit 3 is formed of a voltage dividing unit 31 and a current source unit 14. The voltage dividing unit 31 divides between voltages V21 and V22, and outputs those divided voltages as the detection voltage Vbop1, the release voltage Vbrp1, the detection voltage Vbop2, and the release voltage Vbrp2. The current source unit 14 includes current sources 32 and 33 which adjust respective voltage values of the detection voltage Vbop1, the release voltage Vbrp1, the detection voltage Vbop2, and the release voltage Vbrp2.

In the voltage dividing unit 31, resistors R11, R21, R31, R32, R22, and R12 are connected in series between the voltage V21 and the voltage V22.

Here, in the voltage dividing unit 31, the detection voltage Vbop1 is output from a connection point Tbop1 between the resistor R11 and the resistor R21, the detection voltage Vbrp1 is output from a connection point Tbrp1 between the resistor R21 and the resistor R31, the reference voltage VREF is output from a connection point TREF between the resistor R31 and the resistor R32, the release voltage Vbrp2 is output from a connection point Tbrp2 between the resistor R32 and the resistor R22, and the detection voltage Vbop2 is output from a connection point Tbop2 between the resistor R22 and the resistor R12.

The current source 32 is connected to the connection point Tbrp2, and feeds a current I11 to the connection point Tbrp2 of the voltage dividing unit 31.

Further, the current source 33 is connected to the connection point Tbrp1 which is located symmetrically to the connection point Tbrp2 connected with the current source 32 with respect to a connection point (output point of the reference voltage VREF) between the resistor R31 and the resistor R32, and feeds a current I12 from the connection point Tbrp1 of the voltage dividing unit 31.

With the above-mentioned configuration, in the case where respective current values i11 and i12 of the current I11 and the current I12 are set to be equal to each other, in the voltage dividing unit 31 serving as a voltage dividing resistor, the current I12 is fed from the connection point Tbrp1, and the current I11 is fed to the connection point Tbrp2. Accordingly, there is no change in current value of a current I flowing between the voltage V21 and the voltage V22.

For this reason, when the respective current values i11 and i12 of the currents I11 and I12 are changed, respective voltages of the connection point Tbop1, the connection point Tbrp1, the connection point Tbrp2, and the connection point Tbop2 can be changed without changing a voltage between terminals of the resistor R11 and the resistor R12, a voltage between terminals of the resistor R22 and the resistor R12, and the reference voltage VREF.

Figure 4:
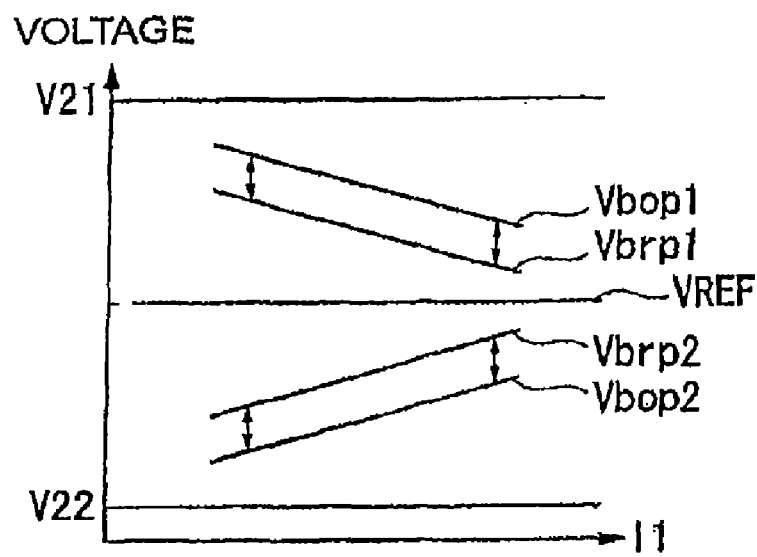
FIG. 4 A waveform diagram illustrating an operation of the variable voltage dividing circuit of FIG. 3.

In other words, the current I11 and the current I12 are adjusted in accordance with the sensitivity of the magnetic sensor as illustrated in FIG. 4, and hence the respective voltages of Vbop1, Vbrp 1, Vbrp2, and Vbop2 can be controlled while keeping hysteresis widths "Vbop1−Vbrp1" and "Vbrp2−Vbop2" as a constant potential difference. FIG. 4 is a waveform diagram illustrating a control result of the detection voltage Vbop1, the release voltage Vbrp1, the detection voltage Vbop2, and the release voltage Vbrp2 through adjustment of the current values i11 and i12 of the circuit of FIG. 3, in which a horizontal axis illustrates the current values i11 and i12 and a vertical axis illustrates voltage values.

In FIG. 4, as the current value i11 of the current I2 fed from the connection point Tbop1 and the current i11 fed to the connection point Tbop2 are increased, potentials of the detection voltage Vbop1 and the release voltage Vbrp1 decrease, and conversely, potentials of the detection voltage Vbop2 and the release voltage Vbrp2 increase. In this case, there is no change in current flowing through the terminal applied with the voltage V21 and the connection point Tbrp1 and in current flowing through the connection point Tbrp2 and the terminal applied with the voltage V22, and hence the hysteresis widths "Vbop1−Vbrp1" and "Vbrp2−Vbop2" are kept constant.

Figure 5:
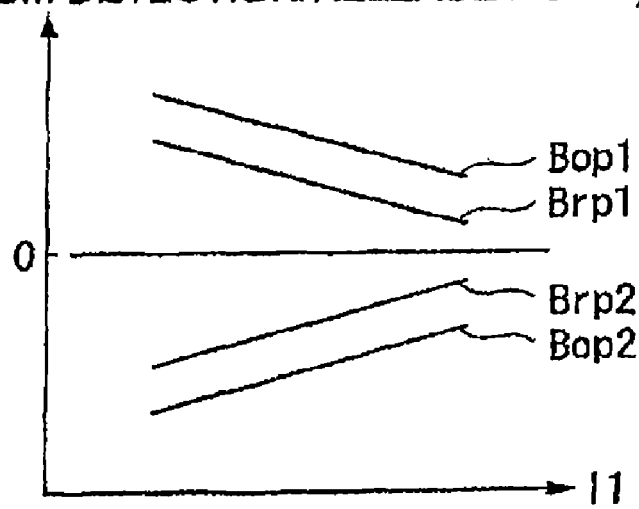
FIG. 5 Another waveform diagram illustrating the operation of the variable voltage dividing circuit of FIG. 3.

Further, it is revealed from FIG. 5 that when the variable voltage dividing circuit 3 illustrated in FIG. 3 is used in FIG. 1 and the respective current values i11 and i12 of the currents I11 and I12 are adjusted to change the detection/release point in accordance with a change in sensitivity of the magnetic sensor due to a change of the power supply voltage, the hysteresis width between the detection magnetic flux density Bop1 and the release magnetic flux density Brp1 and the hysteresis width between the detection magnetic flux density Bop2 and the release magnetic flux density Brp2, which are to be detected, can be kept constant with respect to changes in current values of the currents I11 and I12. In FIG. 5, a horizontal axis illustrates a magnetic flux density of the magnetic field, and a vertical axis illustrates current values of the currents I11 and I12.

In other words, when a resistance value of the resistor R11 and a resistance value of the resistor R12 are assumed to be R10, resistance values of the resistor R21 and the resistor R22 are assumed to be R20, resistance values of the resistor R31 and the resistor R32 are assumed to be R30, and the respective current values i11 and i12 of the current I11 and the current I12 are assumed to be a current value i1, the following expressions can established:

$$VREF=(V21+V22)/2$$

$$Vbrp1=VREF+\{R30/(R10+R20+R03)\}\cdot\{(V21-V22)/2\}-\{(R10+R20)\cdot i1/(R10+R20+R30)\}$$

When the current value i1 is linearly changed, the detection voltage Vbop1, the release voltage Vbrp1, the detection voltage Vbop2, and the release voltage Vbrp2 can be linearly adjusted.

Figure 6:
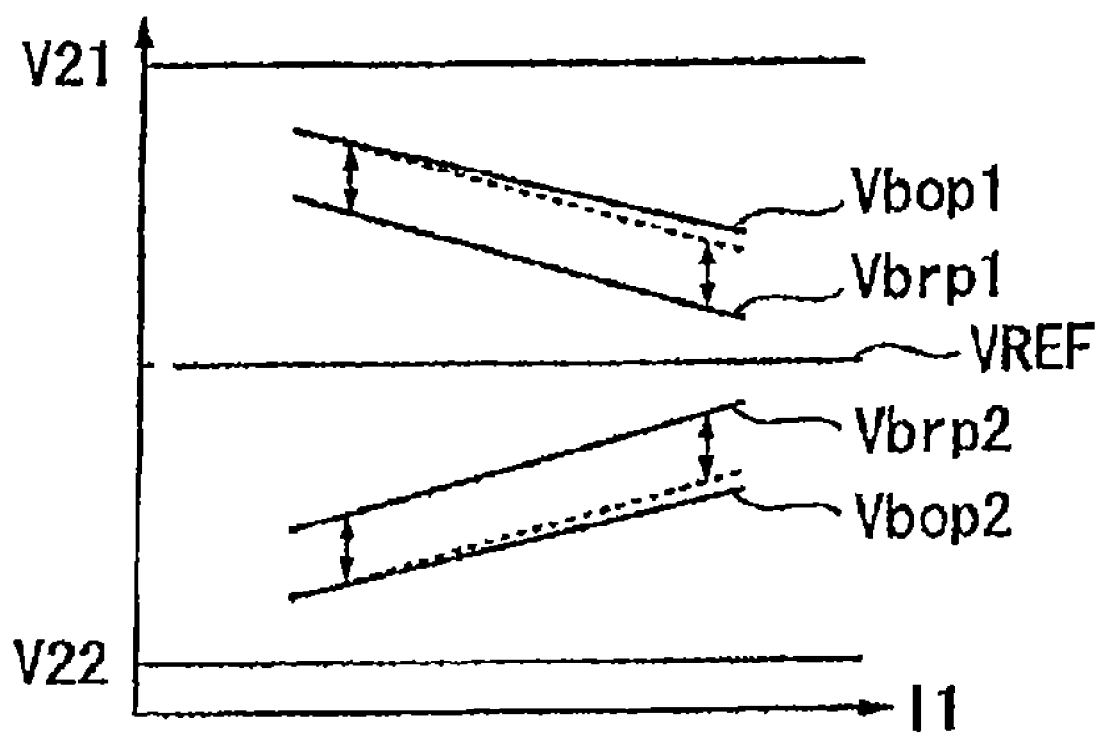
FIG. 6 Still another waveform diagram illustrating the operation of the variable voltage dividing circuit of FIG. 3.

However, for the detection voltage Vbop1, the release voltage Vbrp1, the detection voltage Vbop2, and the release voltage Vbrp2 which are output from the variable voltage dividing circuit 3 illustrated in FIG. 4, as an actual change, there can be seen the dependence of the hysteresis width to some extent as the current values i11 and i12 of the currents I11 and I12 decrease. In FIG. 6, a vertical axis illustrates voltages (voltage V21 and voltage V22) applied to a resistor string (voltage dividing unit 31), and a horizontal axis illustrates current values of the currents I11 and I12.

In other words, "Vbop1−Vbrp 1" is to be obtained as the hysteresis width by:

$$Vbop1-Vbrp1=R20(V21-Vbrp1)$$

When the already obtained Vbrp1 is substituted into the equation above:

$$Vbrp1-Vbrp1=\{R20/(R10+R20)\}\{(R10+R20)/(R10+R20+R30)\}(V21-V22)/2-\{R20/(R10+R20)\}\{(R10+R20)/(R10+R20+R30)\}i1$$

In the second term of the right side, the hysteresis width is deviated from an ideal value due to the current value I1.

In the equation above, when a part of a resistance ratio $\{R20/(R10+R20)\}$ $\{(R10+R20)/(R10+R20+R30)\}$ of the second term of the right side is taken into consideration, the following equation is established:

$$\{R20/(R10+R20)\}\{(R10+R20)/(R10+R20+R30)\}=\{(R20/R10)/(1+R20/R10)\}\{(1+R20/R10)/(1+(R20+R30)/R10)\}$$

When R10 is made to be sufficiently larger than R20 based on the following Expression 1, a change in hysteresis width can be suppressed with respect to a change in current value of the current value I1 of the second term of the right side.

Expression 1

$$\lim_{R10/R20\to\infty}\left(\frac{\frac{R20}{R10}}{1+\frac{R20}{R10}} \cdot \frac{1+\frac{R20}{R10}}{1+\frac{R20+R30}{R10}}\right) \Rightarrow \tag{1}$$

$$\frac{0}{1+0} \cdot \frac{1+0}{1+0} \Rightarrow \frac{0}{1} \Rightarrow 0$$

Figure 7:
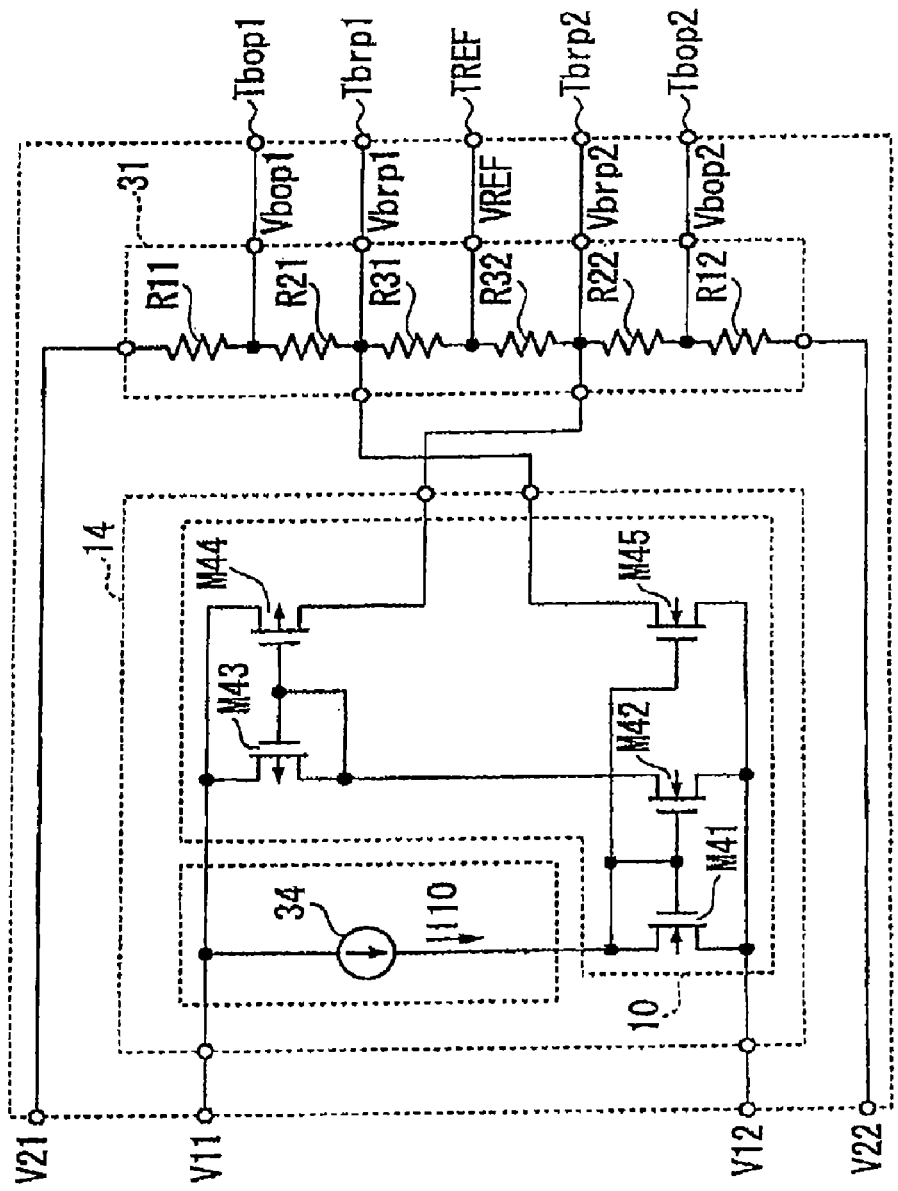
FIG. 7 A circuit diagram of the variable voltage dividing circuit, which illustrates a configuration example of a current source and another current source in detail.

Next, the current sources 32 and 33 of FIG. 3 have, for example, a circuit configuration illustrated in FIG. 7. FIG. 7 is a circuit diagram illustrating a configuration example of the current sources 32 and 33 (V11>V12, V21>V22).

The current sources 32 and 33 are each formed of a current source 34 and a current mirror unit 10. The current mirror unit 10 includes n-channel MOS transistors M41, M42, and M45 and p-channel MOS transistors M43 and M44. Here, in the MOS transistor M41, a drain and a gate thereof are connected to each other, and a source thereof is applied with the voltage V12. In the MOS transistor M42, a gate thereof is connected to the gate of the MOS transistor 41, and a source thereof is applied with the voltage V12. In the MOS transistor 45, a gate thereof is connected to the gate of the MOS transistor M41, and a source thereof is applied with the voltage V12. In the MOS transistor M43, a source thereof is applied with V11, a gate thereof is connected to a drain thereof, and a connection point between the gate and the drain thereof is connected to the drain of the MOS transistor M42. In the MOS transistor M44, a source thereof is applied with V11, and a gate thereof is connected to the gate of the MOS transistor M43.

Accordingly, the MOS transistors M41 and M42, the MOS transistors M41 and M45, and the MOS transistors M43 and M44 form a current mirror, respectively.

The current source 34, the MOS transistors M41, M42, M43, and M44 correspond to the current source 32. A current corresponding to a mirror ratio of a current value of a current I10 flowing from the current source 34 flows through the MOS transistor M42, and further flows through the MOS transistor M43. In addition, a current corresponding to a mirror ratio of the current flowing through the MOS transistor M43 flows through the MOS transistor M44. A current flowing through the MOS transistor M44 corresponds to the current I11 of FIG. 3.

The current source 34 and the MOS transistors M41 and M45 correspond to the current source 33. A current corresponding to the mirror ratio of the current value of the current I10 flowing from the current source 34 flows through the MOS transistor M45. A current flowing through the MOS transistor M45 corresponds to the current I12 of FIG. 3.

Figure 8:
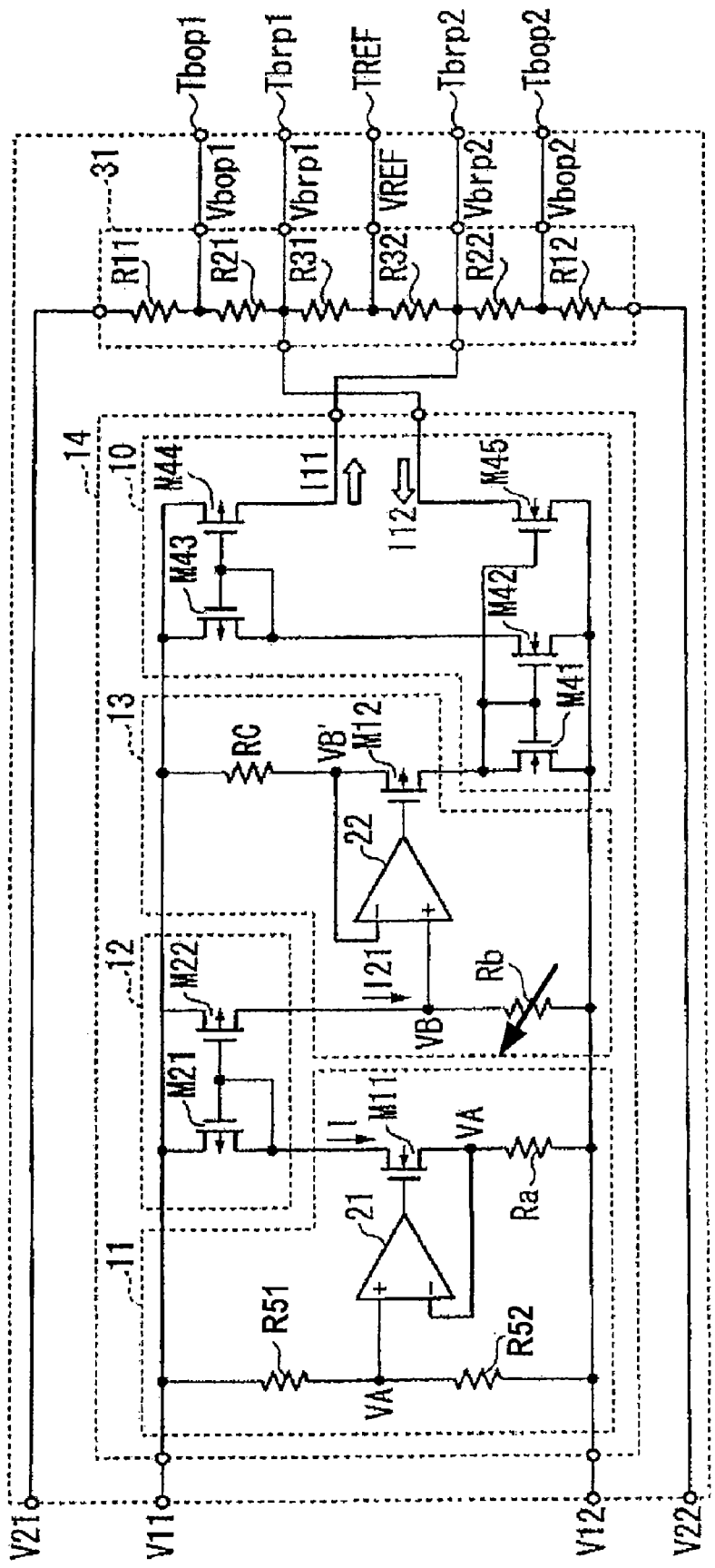
FIG. 8 A circuit diagram illustrating a configuration example of still another current source of FIG. 3.

Next, a configuration example of the current source 34 of FIG. 7, which is capable of varying the current value of the current I10, is described with reference to FIG. 8. FIG. 8 is a circuit diagram illustrating a configuration example of the current source 34 of FIG. 7.

The current source 34 is formed of a reference current generating unit 11, a current mirror circuit 12, and a current adjusting unit 13.

The reference current generating unit 11 is formed of a resistor R51, a resistor R52, an operational amplifier 21, an n-channel MOS transistor M11, and a resistor Ra.

The resistor R51 and the resistor R52 are interposed in series connection between wiring for the voltage V11 and wiring for the voltage V12. In the operational amplifier 21, a non-inverting input terminal (+) is connected to a connection point between the resistor R51 and the resistor R52 and is applied with a voltage VA obtained through division of the voltage V11 and the voltage V12. In the MOS transistor M11, a gate thereof is connected to an output terminal of the operational amplifier 21, and a source thereof is connected to an inverting input terminal (−) of the operational amplifier 21. In the resistor Ra, one end thereof is connected to the source of the MOS transistor M11, and another end thereof is connected to the wiring for the voltage V12.

The current mirror circuit 12 is formed of p-channel MOS transistors M21 and M23. In the MOS transistor M21, a source thereof is connected to the wiring for the voltage V11, a gate thereof is connected to a drain thereof, and the drain thereof is connected to the drain of the MOS transistor M11.

In the MOS transistor M22, a source thereof is connected to the wiring for the voltage V11, and a gate thereof is connected to the gate of the MOS transistor M21.

The current adjusting unit 13 is formed of a resistor Rb, a resistor Rc, an operational amplifier 22, and a p-channel MOS transistor M12.

In the resistor Rb, one end thereof is connected to the drain of the MOS transistor M22, and another end thereof is connected to the wiring for the voltage V12.

In the operational amplifier 22, a non-inverting input terminal (+) thereof is connected to the one end of the resistor Rb and is applied with a voltage VB which is generated correspondingly to a current value of a current supplied from the MOS transistor M22 and a resistance value of the resistor Rb. In the MOS transistor M12, a gate thereof is connected to the output terminal of the operational amplifier 22, and a source thereof is connected to an inverting input terminal (−) of the operational amplifier 22. In the resistor Rc, one end thereof is connected to the wiring for the voltage V12, and another end thereof is connected to the source of the MOS transistor M12.

With the above-mentioned circuit configuration, in accordance with a resistance ratio between the resistor R1 and the resistor R2 which are interposed in series between terminals applied with the voltage V11 and the voltage V12, the reference current generating unit 11 brings a voltage difference between the voltage V11 and the voltage V12 into correspondence with a divided voltage obtained by the division to generate a reference current I.

Then, the current adjusting unit 13 adjusts a current I21 corresponding to the reference current I supplied from the current mirror circuit 12, to thereby adjust the respective current values i11 and i12 of the current I11 and the current I12 which are adjusted currents with respect to the voltage dividing unit 31.

In other words, the voltage VA is determined as follows:

$$VA = r1(V11-V12)/(r1+r2)$$

Owing to virtual short occurring in the operational amplifier 21, VA=VA'. A current having a current value I21 of I21=VA'/Ra flows through the MOS transistor M11. Here, r1 represents a resistance value of the resistor R1, and r2 represents a resistance value of the resistor R2.

In this case, the current having the current value I21 also flows through the MOS transistor M21 as in the case of the MOS transistor M11.

In the current mirror circuit 12, when a mirror ratio between the MOS transistor M21 and the MOS transistor M22 is assumed as follows:

$$I21(\text{current flowing through M21}):I22(\text{current flowing through M22}) = \alpha:1$$

Then, the following equation is established:

$$I22 = (1/\alpha) \cdot (VA'/ra)$$

That is, the current having the current value I22 flows toward the resistor Rb. Here, ra represents a resistance value of the resistor Ra.

When the current I22 flows toward the resistor Rb, a potential difference between the voltage VB and the voltage V12 can be determined by the following equation:

$$VB-V12 = I22 \cdot rb = (1/\alpha) \cdot (VA'/ra) \cdot rb = (1/\alpha) \cdot (rb/ra) \cdot VA'$$

Here, rb represents a resistance value of the resistor Rb. Further, VA'=VA, and hence the equation above can be expressed as follows:

$$VB-V12 = (1/\alpha) \cdot (rb/ra) \cdot \{r1(V11-V12)/(r1+r2)\}$$

Owing to virtual short occurring in the operational amplifier 22, VB'=VB, and hence a current I23 flowing through the MOS transistor M12, that is, flowing through the resistor Rc, is as follows:

$$I23 = (V11-VB')/rc$$

Here, rc represents a resistance value of the resistor Rc.

For simplicity of explanation, hereinafter, a description is given assuming that the voltage V12 is a ground potential, that is, is equal to "0 V".

Then, the following equation is established:

$$VB'=(1/\alpha)\cdot(rb/ra)\cdot V11\cdot\{r1/(r1+r2)\}$$

The current I23 flowing through the resistor Rc is expressed as follows:

$$I23=(V11/rc)\{1-(1/\alpha)(rb/ra)r1/(r1+r2)\}$$

Then, the current corresponding to the resistor Rb can be obtained.

Figure 9:
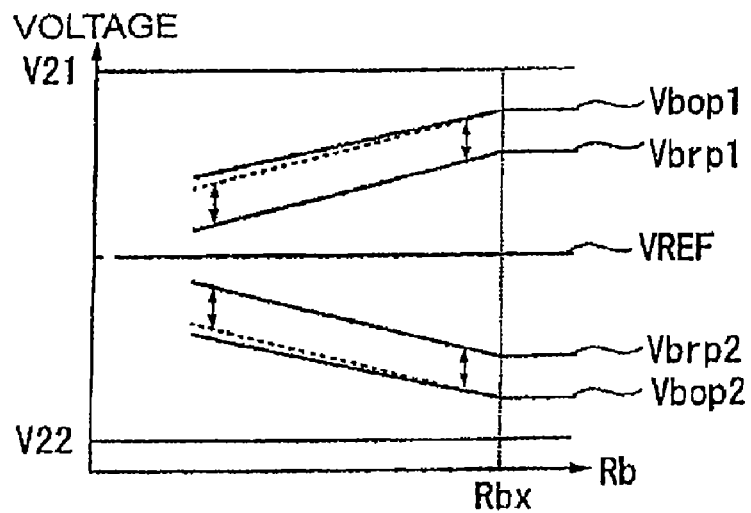
FIG. 9 A waveform diagram illustrating an output of the variable voltage dividing circuit in a case where a resistance value of a resistor of FIG. 8 is changed.

Accordingly, when the resistance value is adjusted with the resistor Rb as the variable resistor, as illustrated in FIG. 9, the current values I11 and I12 are fed to or fed from the voltage dividing circuit 31 as adjusting currents having appropriate current values, with the result that the detection voltage Vbop1, the release voltage Vbrp1, the detection voltage Vbop2, and the release voltage Vbrp2 can be appropriately controlled. FIG. 9 is a graph illustrating a correspondence between the resistance value rb of the resistor Rb, and the voltage values of the detection voltage Vbop1, the release voltage Vbrp1, the detection voltage Vbop2, and the release voltage Vbrp2 which are output from the voltage dividing circuit 3, in which a horizontal axis illustrates a resistance and a vertical axis illustrates a voltage.

Further, the voltage VB' is a voltage lower than the voltage V11, the following formula is established:

$$VB'=(1/\alpha)\cdot(rb/ra)\cdot V11\{r1/(r1+r2)\}\leq V11$$

When the equality is established in $(1/\alpha)\cdot(rb/ra)\{r1/(r1+r2)\}\leq 1$, the following is determined:

$$rb=\{(r1+r2)/r1\}\cdot\alpha\cdot ra$$

With the resistance value rb, VB=V11, and even when the resistance value rb of the resistor Rb is increased further, the voltage is limited by V11. Therefore, as illustrated in FIG. 9, the currents of the current I11 and the current I12 cannot be increased further, whereby the respective voltages of the detection voltage Vbop1, the release voltage Vbrp1, the detection voltage Vbop2, and the release voltage Vbrp2 are not changed.

In other words, a current value of a current for adjustment can be changed in proportion to the resistance value of the resistor Rb serving as the variable resistor, and even when the current value is set as the largest value in the resistor Rb, the current is not changed in the case of exceeding the resistance value rb in the formula above. Therefore, the current value can be easily adjusted without consideration of limitation of the current value.

Figure 10:
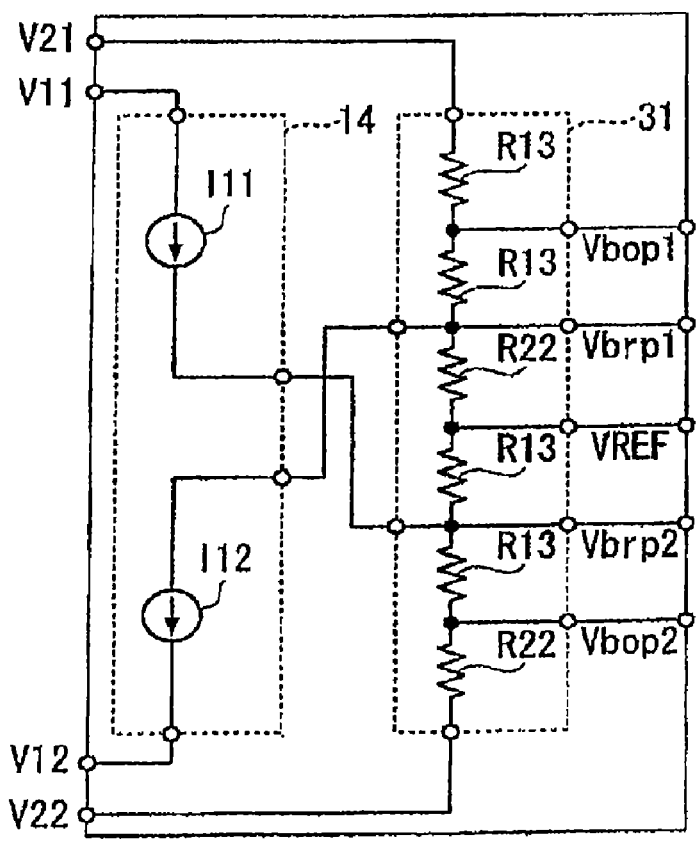
FIG. 10 A block diagram illustrating a configuration example of a variable voltage dividing circuit of FIG. 1 according to another embodiment.

Next, as another embodiment, the variable voltage divider 3 of FIG. 1 can be configured as illustrated in FIG. 10.

The configuration of the variable voltage dividing circuit 3 of FIG. 10 is similar to that of the configuration illustrated in FIG. 3, and the variable voltage dividing circuit 3 is formed of the voltage dividing unit 31 and the current source 32 and the current source 33. The voltage dividing unit 31 divides a potential difference between the voltages V21 and V22, and outputs the respective divided voltages as the detection voltage Vbop1, the release voltage Vbrp1, the detection voltage Vbop2, and the release voltage Vbrp2. The current source 32 and the current source 33 adjust the respective voltage values of the detection voltage Vbop1, the release voltage Vbrp1, the detection voltage Vbop2, and the release voltage Vbrp2.

In the voltage dividing unit 31, the resistors R11, R21, R31, R32, R22, and R12 are connected in series between the voltage V21 and the voltage V22.

Here, in the voltage dividing unit 31, the detection voltage Vbop1 is output from the connection point Tbop1 between the resistor R11 and the resistor R21, the detection voltage Vbrp1 is output from the connection point Tbrp1 between the resistor R21 and the resistor R31, the reference voltage VREF is output from the connection point TREF between the resistor R31 and the resistor R32, the release voltage Vbrp is output from the connection point Tbrp2 between the resistor R32 and the resistor R22, and the detection voltage Vbop2 is output from the connection point Tbop2 between the resistor R22 and the resistor R12.

Contrary to the configuration of FIG. 3, the current source 32 is connected to the connection point Tbrp1, and feeds the current I11 to the voltage dividing unit 31.

The current source 33 is connected to the connection point Tbrp2 which is located symmetrically to the connection point Tbrp1 connected with the current source 32 with respect to the connection point between the resistor R31 and the resistor R32, and feeds the current I12 from the voltage dividing unit 31.

With the above-mentioned configuration, in the case where the respective current values i1 and i12 of the current I11 and the current I12 are set to be equal to each other, in the voltage dividing unit 31 serving as a voltage dividing resistor, the current I11 is fed to the connection point Tbrp1, and the current I12 is fed from the connection point Tbrp2. Accordingly, there is no change in current value of the current I flowing between the voltage V21 and the voltage V22.

Figure 11:
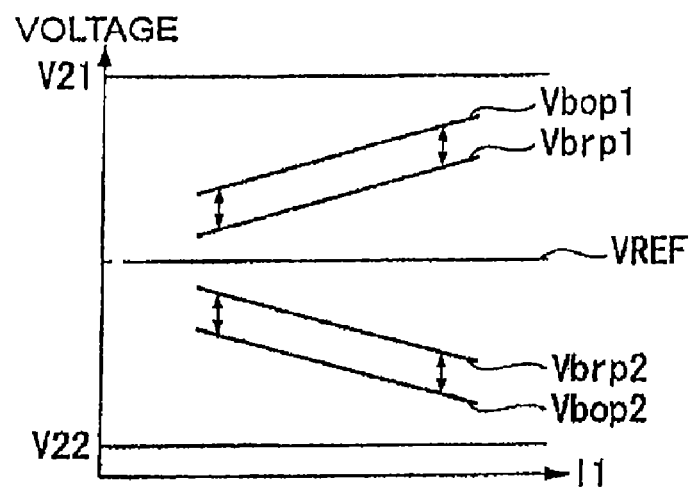
FIG. 11 A waveform diagram illustrating an operation of the variable voltage dividing circuit of FIG. 10.
Figure 12:
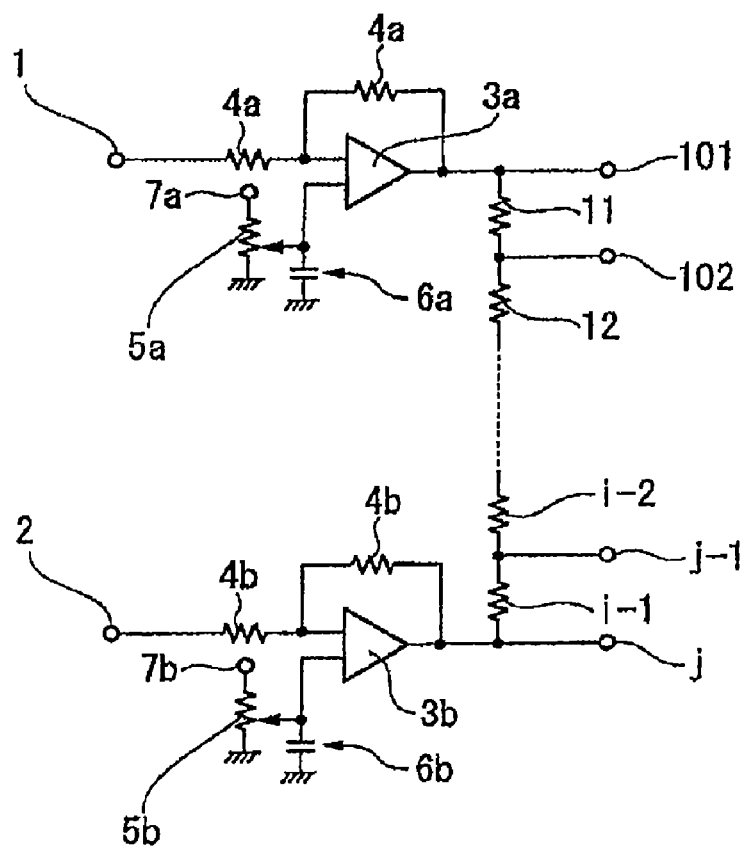
FIG. 12 A block diagram illustrating a configuration example of a variable voltage dividing circuit of a conventional example.
Figure 13:
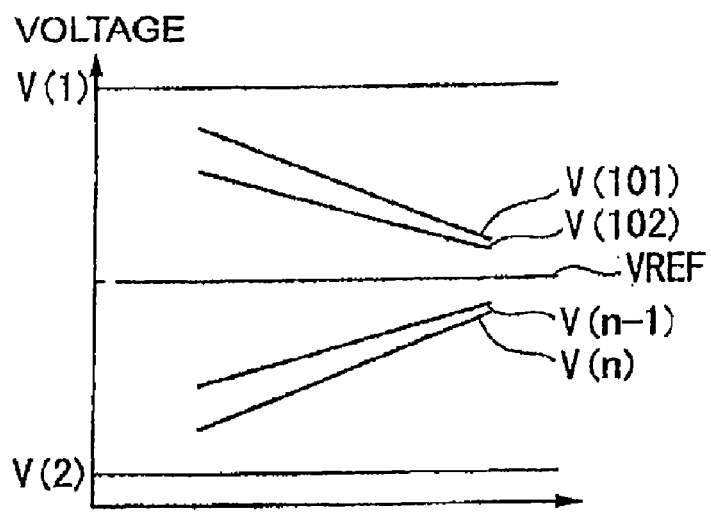
FIG. 13 A block diagram illustrating an operation of the variable voltage dividing circuit of FIG. 12.
Figure 14:
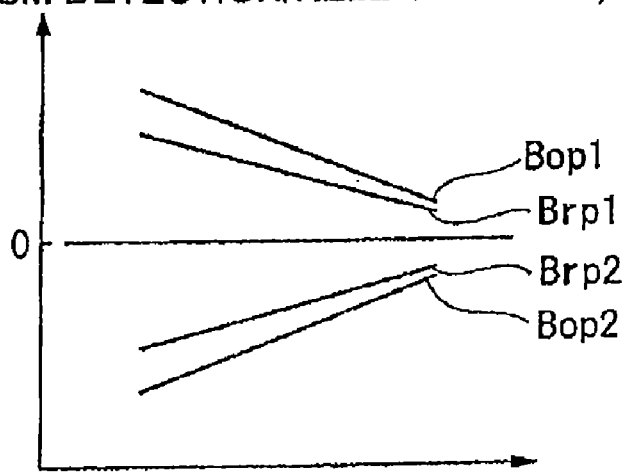
FIG. 14 Another block diagram illustrating the operation of the variable voltage dividing circuit of FIG. 12.

For this reason, when the respective current values i1 and i12 of the currents I11 and I12 are changed, as illustrated in FIG. 11, respective voltages of the connection point Tbop1, the connection point Tbrp1, the connection point Tbrp2, and the connection point Tbop2 can be changed without changing the voltage between the terminals of the resistor R11 and the resistor R12, the voltage between the terminals of the resistor R22 and the resistor R12, and the reference voltage VREF. FIG. 11 is a waveform diagram illustrating control results of the detection voltage Vbop1, the release voltage Vbrp1, the detection voltage Vbop2, and the release voltage Vbrp2 through adjustment of the current values I11 and I12 of the circuit illustrated in FIG. 10, in which a horizontal axis illustrates the current values of the currents I11 and I12 and a vertical axis illustrates voltage values.

In FIG. 11, as the current value i11 of the current I12 fed from the connection point Tbop1 and the current i11 fed to the connection point Tbop1 are increased, potentials of the detection voltage Vbop1 and the release voltage Vbrp1 increase, and conversely potentials of the detection voltage Vbop2 and the release voltage Vbrp2 decrease. In this case, there is no change in current flowing through the voltage applied with the voltage V21 and the connection point Tbrp1 and current flowing through the connection point Tbrp2 and the terminal applied with the voltage V22, and hence the hysteresis widths "Vbop1−Vbrp1" and "Vbrp2−Vbop2" can be kept constant as in the case of the configuration of FIG. 3.

The invention claimed is:

1. A variable voltage dividing circuit, comprising:
   a voltage dividing unit which includes a resistor string formed of a plurality of resistors connected in series and outputs divided voltages divided at connection points of the plurality of resistors, one end of the resistor string being applied with a first voltage, another end thereof being applied with a second voltage,
   wherein the voltage dividing unit outputs a plurality of threshold voltages that represent detection magnetic flux density and release magnetic flux density of a magnetic sensor, the threshold voltages comprising a first detection voltage, a first release voltage, a reference voltage, a second detection voltage and a second release voltage with a relationship of the first detection voltage>the first release voltage>the reference voltage>the second release voltage>the second detection voltage;

a first constant current source connected to a first connection point of the resistor string; and a second constant current source connected to a second connection point located symmetrically to the first connection point with respect to a center of the resistor string in the resistor string, wherein, in accordance with a voltage difference between the first voltage and the second voltage, one of the first constant current source and the second constant current source subtracts a first adjustment current from a current flowing through the resistor string, and another thereof feeds a second adjustment current to the resistor string;

wherein in response to a change in the voltage difference between the first voltage and the second voltage, the first constant current source and the second constant current source adjust the first adjustment current and the second adjustment current such that hysteresis widths of a difference between the first detection voltage and the first release voltage and a difference between the second detection voltage and the second release voltage are kept as a constant potential difference.

2. A variable voltage dividing circuit according to claim 1, wherein:
the first adjustment current and the second adjustment current have the same current value; and
in response to a change of the first voltage and a change of the second voltage, the first constant current source and the second constant current source each control the first adjustment current and the second adjustment current by a current value which does not change a voltage between the first connection point and a first terminal and a voltage between the second connection point and a second terminal.

3. A variable voltage dividing circuit according to claim 1, wherein:
the plurality of resistors included in the voltage dividing unit comprise a first resistor, a second resistor, a third resistor, a fourth resistor, a fifth resistor, and a sixth resistor which are connected in series;
one end of the first resistor is applied with the first voltage, and another end of the sixth resistor is applied with the second voltage; and
a resistance value of the second resistor is set to be smaller compared with the first resistor, and a resistance value of the fifth resistor is set to be smaller compared with the sixth resistor.

4. A variable voltage dividing circuit according to claim 1, wherein the first constant current source and the second constant current source are each formed of a current mirror circuit using the same constant current generated by a third constant current source.

5. A variable voltage dividing circuit,
a voltage dividing unit which includes a resistor string formed of a plurality of resistors connected in series and outputs divided voltages divided at connection points of the plurality of resistors, one end of the resistor string being applied with a first voltage, another end thereof being applied with a second voltage;
a first constant current source connected to a first connection point of the resistor string; and
a second constant current source connected to a second connection point located symmetrically to the first connection point with respect to a center of the resistor string in the resistor string,
wherein, in accordance with a voltage difference between the first voltage and the second voltage, any one of the first constant current source and the second constant current source subtracts a first adjustment current from a current flowing through the resistor string, and another thereof feeds a second adjustment current to the resistor string; and
wherein the first constant current source and the second constant current source are each formed of a current mirror circuit using the same constant current generated by a third constant current source; and
wherein the third constant current source comprises:
a reference current generating unit which generates a reference current;
a variable resistor which is fed with the reference current and has a variable resistance value;
an operational amplifier which includes:
a non-inverting input terminal applied with a voltage generated in the variable resistor; and
an inverting input terminal connected with a power source through another resistor; and
a MOS transistor comprising a source, a drain, and a gate, any one of the source and the drain being connected with the inverting input terminal of the operational amplifier, the gate being connected to an output terminal of the operational amplifier, for outputting the adjustment current from another of the source and the drain.

6. A magnetic sensor circuit, comprising:
the variable voltage dividing circuit according to claim 1;
a selector which outputs a divided voltage from any one of connection points of the variable voltage dividing circuit in correspondence with a selection signal; and
an operational amplifier which includes:
one terminal input with a detection voltage of the magnetic sensor; and
another terminal input with the divided voltage output from the selector.

* * * * *